United States Patent [19]

Manku

[11] Patent Number: 5,602,487
[45] Date of Patent: Feb. 11, 1997

[54] CAPACITANCE MEASURING DEVICE

[75] Inventor: Tajinder Manku, Nepean, Canada

[73] Assignee: Mitel Corporation, Kanata, Canada

[21] Appl. No.: 294,602

[22] Filed: Aug. 22, 1994

[51] Int. Cl.$^6$ .................................................. G01R 27/26
[52] U.S. Cl. ............................ 324/678; 324/679; 327/288
[58] Field of Search ...................... 324/678, 679; 327/288; 364/481; 73/304 C

[56] References Cited

U.S. PATENT DOCUMENTS

| | | | |
|---|---|---|---|
| 3,212,077 | 10/1965 | Edwards | 73/304 C |
| 3,344,668 | 10/1967 | Schuck | 73/304 C |
| 3,360,951 | 1/1968 | Hoenisch | 73/304 C |
| 3,375,716 | 4/1968 | Hersch | 73/304 C |
| 3,737,683 | 6/1973 | Sangster | 327/288 |
| 4,165,641 | 8/1979 | Pomerantz et al. | 73/304 C |
| 4,266,144 | 5/1981 | Bristol | 73/304 C |
| 4,472,643 | 9/1984 | Furuyama | 327/288 |
| 4,496,852 | 1/1985 | Blaser et al. | 327/288 |
| 5,179,345 | 1/1993 | Jenkins et al. | 324/678 |
| 5,212,454 | 5/1993 | Proebsting | 324/679 |

FOREIGN PATENT DOCUMENTS

| | | | |
|---|---|---|---|
| 0154507 | 3/1982 | Germany . | |
| 473904 | 12/1975 | U.S.S.R. | 73/304 C |

*Primary Examiner*—Maura K. Regan
*Attorney, Agent, or Firm*—Marks & Clerk

[57] ABSTRACT

A capacitance measuring device comprises a MOS transistor having a source, drain, and gate; a first capacitor $C_1$ connected between said gate and said drain so that charge is coupled from said drain onto said gate; and a second capacitor $C_2$ for connection to a source of gate voltage $V_G$ and connected to said gate. One of the first and second capacitors has a known capacitance and the other has an unknown capacitance. A DC voltage is supplied between the source and drain to cause a saturation current to flow therebetween. The ratio $\delta V_G/\delta V_d$ for the saturation current, where $V_G$ is the applied gate voltage, and $V_d$ is the drain voltage is determined and the unknown capacitance is derived from the relationship $C_1/C_2 = -\delta V_G/\delta V_d$.

10 Claims, 1 Drawing Sheet

CAPACITANCE MEASURING DEVICE

BACKGROUND OF THE INVENTION

This invention relates to a capacitance measuring device and a method of measuring capacitance.

Presently most practical methods of measuring capacitance require an AC input and output signal. For example, U.S. Pat. No. 5,212,454 describes an arrangement wherein a high frequency voltage signal is applied to a capacitor and the resulting current measured.

SUMMARY OF THE INVENTION

An object of the invention is to provide a method and device for measuring capacitance that avoids the need to apply an AC input.

Accordingly the invention provides a capacitance measuring device comprising a MOS transistor having a source, drain, and gate; a first capacitor $C_1$ connected between said gate and said drain so that charge is coupled from said drain onto said gate; a second capacitor $C_2$ for connection to a source of gate voltage $V_G$ and connected to said gate; one of said first and second capacitors having a known capacitance and the other of said first and second capacitors having an unknown capacitance; means for applying a variable known DC voltage between said source and drain to cause a saturation current to flow therebetween; and means for determining the ratio $\delta V_G/\delta V_d$ for said saturation current, where $V_G$ is the applied gate voltage, and $V_d$ is the drain voltage; said unknown capacitance thereby being derivable from the relationship $C_1/C_2 = -\delta V_G/\delta V_d$.

In the preferred embodiment, the MOS transistor is an n-channel MOSFET.

The invention makes use of the fact that in an arrangement where the gate is isolated from the gate voltage by a capacitor $C_x$, and charge is coupled from the drain to the gate by another capacitor C, the amount of charge that is coupled is determined by the ratio $C/C_x$, or in other words $$\frac{C}{C_x} = -\frac{\partial V_G}{\partial V_d}\bigg|_{Ids-sat}$$

The invention thus allows capacitance to be measured using D.C. alone. The device can be integrated on a chip using either CMOS, BICMOS, NMOS, or any technology that can fabricate MOS devices.

The key aspect of this invention is that it can measure, the capacitance using only D.C. measurements.

The invention also provides a method of measuring capacitance, comprising isolating a gate region of a MOS device from exterior biasing with a first capacitor, coupling charge between a drain and said gate of said MOS device with a second capacitor, one of said first and second capacitors having an unknown capacitance, and measuring the rate of change of gate voltage with respect to drain voltage at saturation current to derive said unknown capacitance therefrom.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 1:
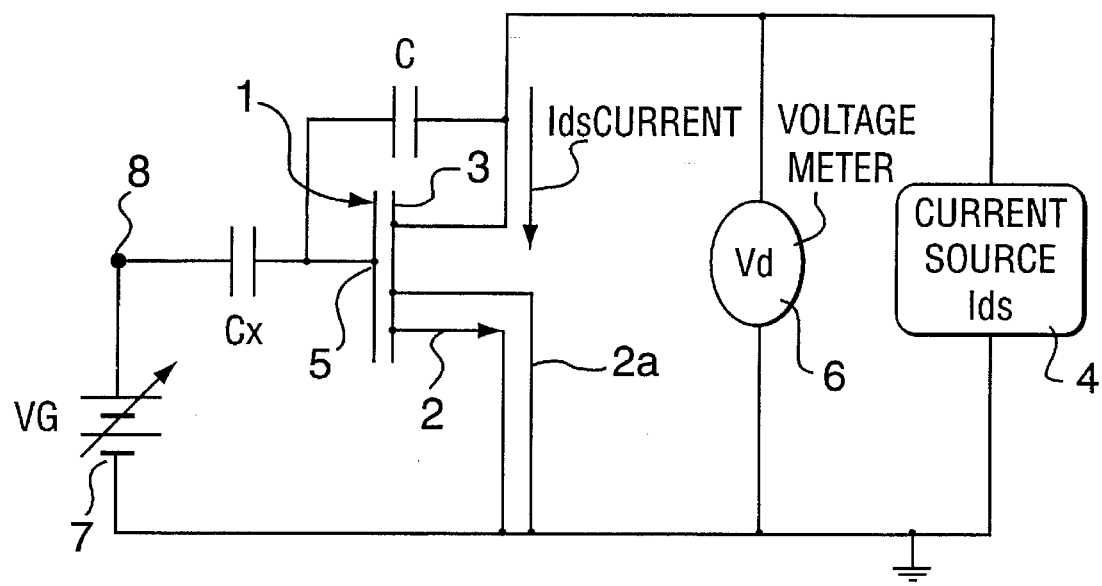
FIG. 1 is a circuit diagram of a first embodiment of a device in accordance with the invention.

Referring to FIG. 1, a n-channel MOSFET 1 has a source 2 and substrate 2a connected to ground (GND) and a drain 3 connected to a constant current supply 4. This current supply 4 supplies a saturation current $I_{ds}$ that flows between the drain 3 and source 2. The drain voltage $V_d$ is measured by a voltage meter 6 connected between the drain 3 and ground (GND).

MOSFET 1 has a gate 5 connected through a capacitor $C_x$ of unknown capacitance to an electrode 8 connected to a source 7 of variable known gate voltage $V_G$. A capacitor C connects the drain 3 to the gate 5 so as to couple charge from the drain 3 to the gate 5.

This configuration thus allows the drain to place or couple charge on to the gate of the MOS transistor The capacitor $C_x$ attached from $V_G$ to the gate is used to isolate the coupling region (i.e. the gate region) from any exterior biasing. The amount of charge that is coupled is determined by the ratio C/Cx. As this ratio increases the amount of coupling also increases. The magnitude of coupling is monitored through the structures current-voltage characteristics. In order to measure capacitance, the ratio $C_x/C$ is determined from the rate of change of the measured drain voltage with respect to the applied variable gate voltage $V_G$ when the source drain current $I_{ds}$ is saturated. The unknown capacitance is derived from the relationship $$\frac{C}{C_x} = -\frac{\partial V_G}{\partial V_d}\bigg|_{Ids-sat}$$

The measurement is thus performed with the device operating in saturation.

In an alternative embodiment, a p-channel device can be used instead of an n-channel device by switching the polarities of all the voltages.

Extra components can be added for stability, obtaining better accuracy, or for integration purposes.

Figure 2:
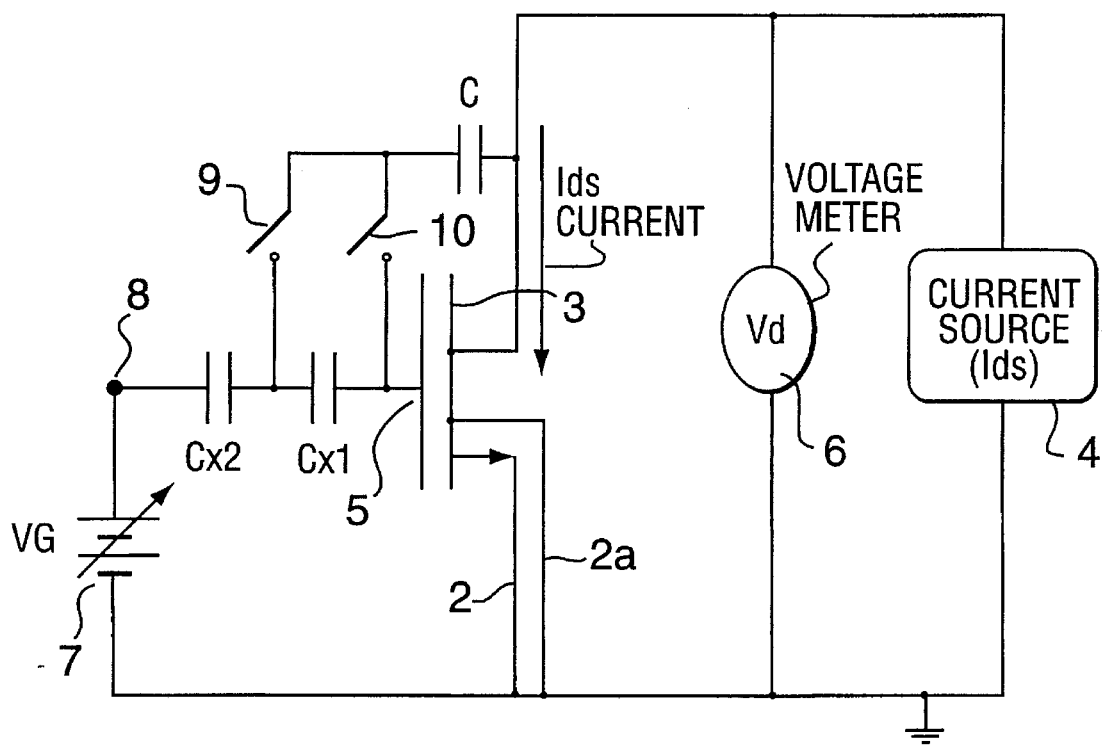
FIG. 2 is a circuit diagram of a second embodiment of a device in accordance with the invention.

In a second embodiment shown in FIG. 2, the device, which is otherwise similar to FIG. 1 has two input gate capacitors $Cx_2$ and $Cx_1$ in series. Switches 9 and 10 allow the coupling capacitor C no be connected in series selectively either with the series combination of $Cx_2$ and $Cx_1$, or $Cx_2$ alone. In this case, the following relationship holds:

$$\frac{C}{C_x} = \left(\frac{\partial V_G}{\partial V_d}\bigg|_{9on} - \frac{\partial V_G}{\partial V_d}\bigg|_{10on}\right)\bigg|_{Ids-sat}$$

where now $C_{x1} = (Cx_{x1}^{-1} + Cx_{x2}^{-1})^{-1}$

This basic mechanism for coupling charge from C to the gate remains the same as described with reference to FIG. 1.

This above configuration allows one to measure capacitance while making no restrictions on the geometry of the transistor. In the above equation, "on" means the switch is short circuited. It is understood that when one switch is on the other is assumed off.

From the above relationship it will be apparent to the skilled reader that the roles of capacitors C and $C_x$ can be reversed. So long as one is known and the other is unknown, it makes no difference which is which.

The invention described can be used for any application in which capacitance measurements are made. Some specific applications include sensing applications based on capacitance measurons, actuator applications based on capacitance monitoring and driving, basic capacitance meters, CV (Capacitive-voltage) meters, and Charge coupling circuits.

I claim:

1. A capacitance measuring device comprising a MOS transistor having a source, drain, and gate; a first capacitor $C_1$ connected between said gate and said drain so that charge is coupled from said drain onto said gate; a second capacitor $C_2$ for connection to a source of gate voltage $V_G$ and connected to said gate; one of said first and second capacitors having a known capacitance and the other of said first and second capacitors having an unknown capacitance; means for applying a variable known DC voltage between said source and drain to cause a saturation current to flow therebetween; and means for determining the ratio $\delta V_G/\delta V_d$ for said saturation current, where $V_G$ is the applied gate voltage, and $V_d$ is the drain voltage; said unknown capacitance thereby being derivable from the relationship $C_1/C_2 = -\delta V_G/\delta V_d$.

2. A capacitance measuring device as claimed in claim 1, wherein said second capacitor has unknown capacitance.

3. A capacitance measuring device as claimed in claim 1, further comprising a further capacitor in series with said second capacitor, and switch means for selectively connecting one or both of said series-connected capacitors in series with said first capacitor.

4. A capacitance measuring device as claimed in claim 1, wherein said MOS device is an n-channel MOSFET.

5. A capacitance measuring device as claimed in claim 1, wherein said MOS device is an p-channel MOSFET.

6. A method of measuring capacitance, comprising isolating a gate region of a MOS device from exterior biasing with a first capacitor, coupling charge between a drain and said gate of said MOS device with a second capacitor, one of said first and second capacitors having an unknown capacitance, and measuring the rate of change of gate voltage with respect to drain voltage at saturation current to derive said unknown capacitance therefrom.

7. A method as claimed in claim 6, comprising connecting a third capacitor in series with said first capacitor, and selectively switching said capacitors so that alternately the series combination of said first and third capacitors, and said third capacitor only are connected to said drain.

8. A method as claimed in claim 6, wherein said MOS device is an n-channel MOSFET.

9. A method as claimed in claim 6, wherein said MOS device is an p-channel MOSFET.

10. A method as claimed in claim 1 wherein said determining means includes a voltage meter measuring said drain voltage.

* * * * *